United States Patent [19]

Stephens et al.

[11] 4,249,299
[45] Feb. 10, 1981

[54] EDGE-AROUND LEADS FOR BACKSIDE CONNECTIONS TO SILICON CIRCUIT DIE

[75] Inventors: Craig P. Stephens, Carlsbad; James C. Rill, Del Mar, both of Calif.

[73] Assignee: Hughes Aircraft Company, Culver City, Calif.

[21] Appl. No.: 17,794

[22] Filed: Mar. 5, 1979

Related U.S. Application Data

[63] Continuation of Ser. No. 791,768, Apr. 28, 1977, abandoned.

[51] Int. Cl.³ .............................................. B01J 17/00
[52] U.S. Cl. ...................................... 29/578; 29/580; 29/583; 29/589; 51/5 B; 51/324; 427/255.5
[58] Field of Search ................ 29/578, 580, 583, 589; 118/49 W; 51/5 B, 5 C, 5 D, 323, 324; 427/248 G, 255.5

[56] References Cited

U.S. PATENT DOCUMENTS

| | | | |
|---|---|---|---|
| 3,022,568 | 2/1962 | Nelson | 29/583 |
| 3,509,431 | 4/1970 | Iles | 29/572 |
| 3,579,816 | 5/1971 | Ingraham | 29/590 |
| 3,624,677 | 11/1971 | Pearson | 29/583 |
| 3,698,080 | 10/1972 | Berner | 29/590 |
| 3,752,691 | 8/1973 | Little | 427/255.5 |
| 3,772,770 | 11/1973 | Arndt | 29/583 |
| 3,888,053 | 6/1975 | White | 51/323 |
| 4,089,989 | 5/1978 | White | 427/255.5 |

FOREIGN PATENT DOCUMENTS 931442  8/1973  Canada .................. 427/248 G

*Primary Examiner*—W. C. Tupman
*Attorney, Agent, or Firm*—Lewis B. Sternfels; W. H. MacAllister

[57] ABSTRACT

Electrical connection is made to circuits in a silicon die from its bottom surface through vacuum deposited contacts formed around one of its edges.

6 Claims, 14 Drawing Figures

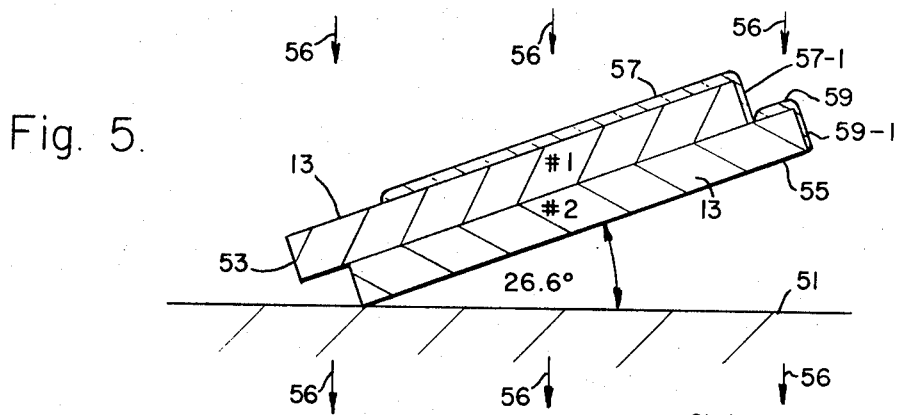
Fig. 5.
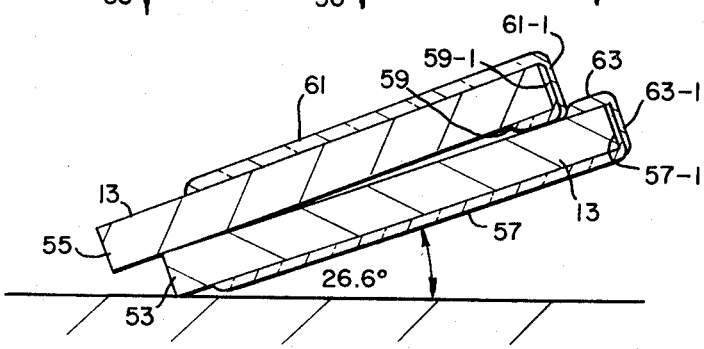
Fig. 6.
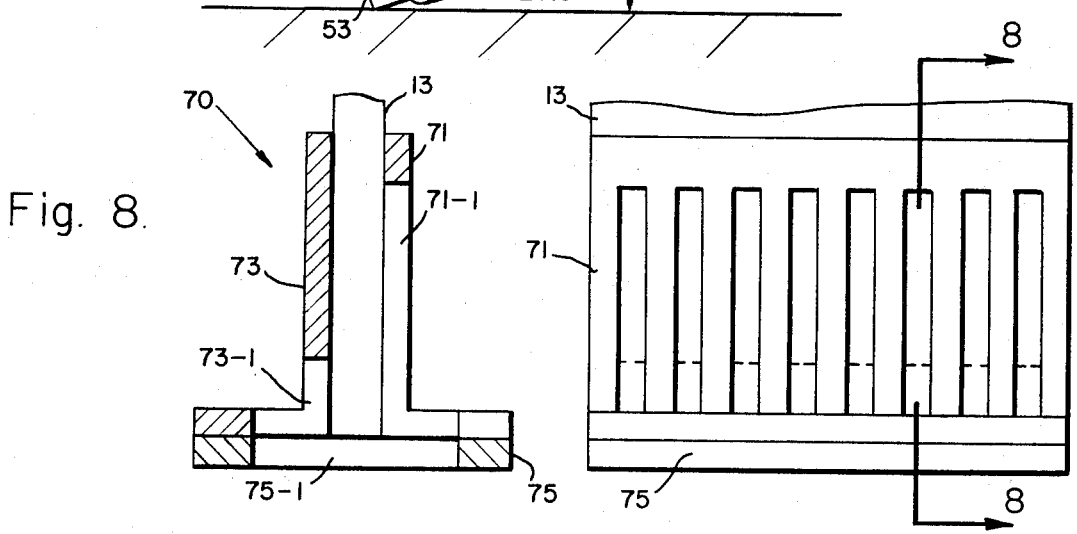
Fig. 8.
Fig. 9.
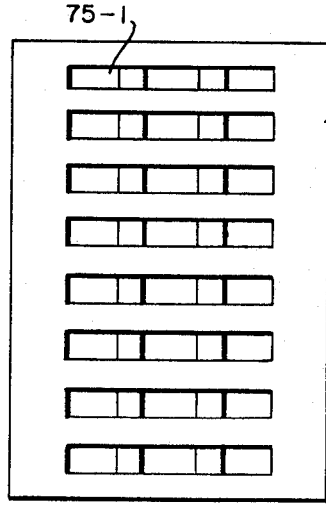
Fig. 7.
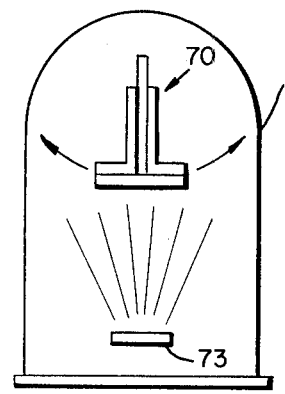
Fig. 10.

EDGE-AROUND LEADS FOR BACKSIDE CONNECTIONS TO SILICON CIRCUIT DIE

This is a continuation of application Ser. No. 791,768 filed Apr. 28, 1977, now abandoned.

BACKGROUND OF THE INVENTION

The present invention relates generally to integrated circuits and more particularly to forming an array comprised of a mosaic of interconnected integrated circuit dice.

U.S. Pat. No. 3,862,360 discloses a liquid crystal display panel whose backplate is a semiconductor wafer which serves both to support an array of reflective electrodes in a common plain and to contain, fabricated in its surface, a plurality of switching transistors for controlling selective actuation of those electrodes. U.S. Pat. No. 3,861,783 discloses an improved liquid crystal display wherein the backplate is made up of a plurality of interconnected, square, semiconductor wafers (hereinafter "dice").

Connection to circuits in a given die is accomplished in accordance with the teachings of U.S. Pat. No. 3,861,783 through a plurality of connectors, each of which extends around the edges of the die from its top surface, wherein the various switching elements are formed, to their bottom surfaces, which are supported on a common backing such as a plate of glass. Circuits in adjacent dice are interconnected by an array of bridging connectors pressed against the bottom surfaces of the dice by the backing plate so that corresponding pairs of connectors of interfacing silicon dice are interconnected through respective ones of the bridging connectors.

It is the principal object of the present invention to provide an improved method for putting connectors around the edges of silicon dice which are to be interconnected into a larger array.

SUMMARY OF THE INVENTION

The above and other objects of the invention are accomplished by mounting a silicon wafer containing the circuitry for forming at least one die on a silicon backing by means of a relatively soft adhesive. The die is then formed by sawing through the wafer and into the silicon backing, making at least four cuts to define a rectangular die having first and second major surfaces, one containing circuitry, and four straight sides which are formed by the sawing operation. The die is then separated from the backing and its edges, defined by the intersection of its major surfaces with at least one of its sawed sides, are burnished to remove spikes and other residue which might have been left after the sawing operation.

An insulating layer of uniform thickness is next sputtered around the side whose edges have just been burnished, after which a plurality of strips of metal of uniform thickness are simultaneously formed over the sputtered insulation. These strips extend from the conductors which are in the major surface of the die over the insulating layer, around the side and onto its second major surface. In keeping with a particularly desirable feature of the invention the strips of metal are formed by masking the die so as to expose a plurality of U-shaped strips thereof, each strip extending over and around its chosen side. Thereafter, metal such as aluminum is evaporated from a source onto the masked area of the die while the die is being turned relative to the source. As a result, the U-shaped strips receive a uniformally thick metal layer along their length from the source.

Further objects and features of the invention will become apparent from the following description and drawings, in which:

FIGS. 5 and 6 illustrate the manner in which a layer of insulation may be formed around the side of a pair of silicon dice;

FIG. 7 is a bottom view of a silicon die held in a mask designed to expose U-shaped strips of the die;

FIG. 8 is a cross section through lines 8—8 of FIG. 9 illustrating the exposed portions of the silicon die;

FIG. 9 is a side view of the silicon die and mask illustrated in FIGS. 7 and 8; and FIG. 10 illustrates an apparatus which may be used to carry out the evaporation of a metal layer through the mask, shown in FIGS. 7, 8 and 9 onto a silicon die.

DESCRIPTION OF A PREFERRED EMBODIMENT

Figure 1:
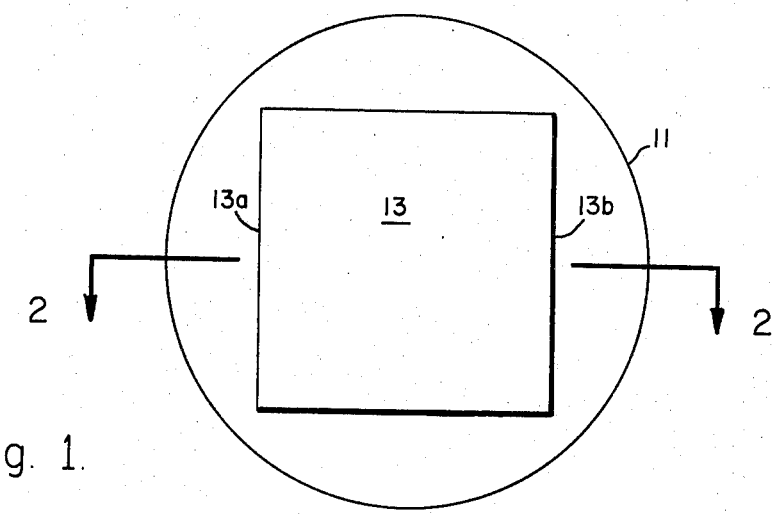
FIG. 1 depicts a silicon wafer from which a square die may be cut.
Figure 2:
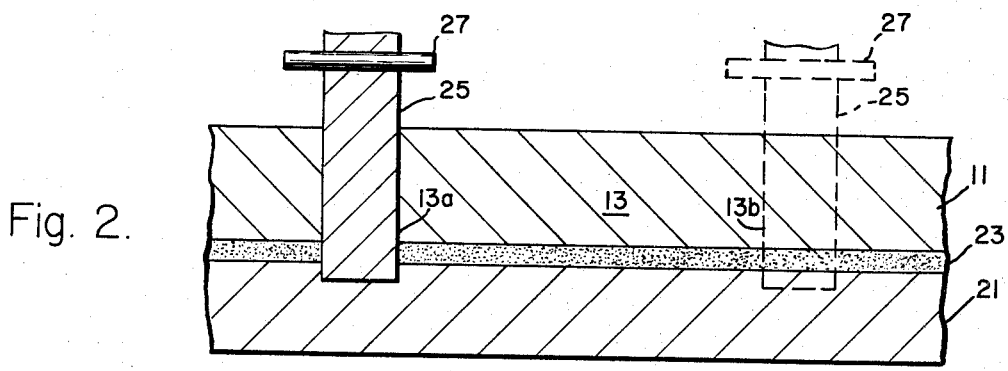
FIG. 2 is a cross section along lines 2—2 of FIG. 1 illustrating the manner in which the silicon wafer of FIG. 1 may be sawed in order to create spur-free sides necessary for the successful formation of connectors extending around them.

Illustrated in FIG. 1 is a standard silicon wafer 11 in which there have been fabricated the integrated circuits for at least one die 13. Since it is desirable to reduce the number of dice which have to be interconnected to a minimum, usually only a single die will be cut from each wafer in order to maximize the size of each die. What will be described herein is the manner in which the die 13 is further processed in order to form connectors around one of its ends 13a. The first step in the process is to cut the die 13 out of the silicon wafer 11. In preparation for this step the wafer 11 is mounted on a supporting member 21 by means of a soft adhesive 23, such as shown in FIG. 2. The cutting is accomplished by means of a commercially available silicon dicing saw whose diamond-impregnated blade 25 rotates on its shaft 27 at approximately 20,000 RPM. A suitable such rotating saw is the Tempress Model 401. In accordance with the invention a cut is made with the saw blade 25 through the entire depth of the wafer 11 to insure that the cut will produce smoothly finished sides for the die 13. This contrasts with previous techniques in which the top of the wafer was first scribed and the wafer was then cracked, resulting in jagged portions along the sides thus produced. In order to permit the blade readily to penetrate through the wafer 11, silicon is used for the support member 21 so as to prevent any distortions in the cut which might result if the blade 25 were to enter a material having a different hardness than that of the wafer 11. Two successive cuts are illustrated in FIG. 2, the first one along the line 13a and the second along the line 13b shown in FIG. 1.

Figure 3A:
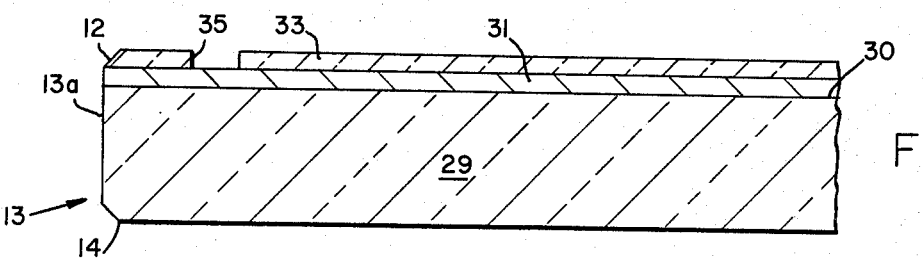
FIGS. 3a–3e are a series of diagrams showing a cross section along the lines 3—3 of FIG. 4 at successive stages of the fabrication of the edge-around connectors.

Taking the silicon die 13 as exemplary of how the remaining dice 15, 17 and 19 are processed, each edge around which contacts are to be formed is burnished to remove any debris which might have been created by the sawing operation. Thus, as shown in FIG. 3a, the side 13a of the silicon die 13 terminates in slightly beveled edges 12 and 14. Along its upper surface 30 the silicon die 13 includes conductors 31 leading to circuits formed in the surface of the die. Both conductors and circuits are covered by a layer of oxide 33. A contact opening 35 in the oxide layer 33 near the side 13a is formed by standard photographic and etching techniques. Although the conductor 31 is shown as a diffusion formed in the surface of the die 13 it could also be formed by other techniques such as a doped polycrystalline silicon strip on top of an insulating layer formed on the surface of the silicon die 13. It will be understood that all of the mentioned components in and on the die surface 30 are formed before the wafer 11 has been cut into separate dice 13, 15, 17 and 19.

Figure 3B:
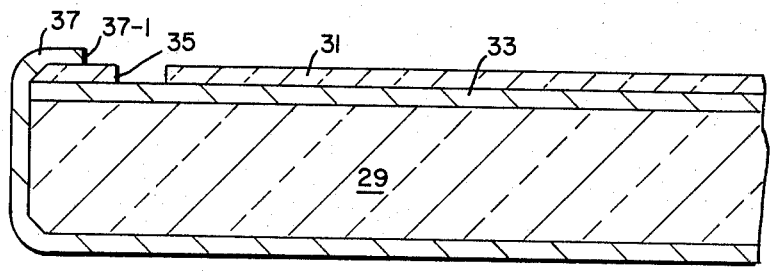
Figure 4:
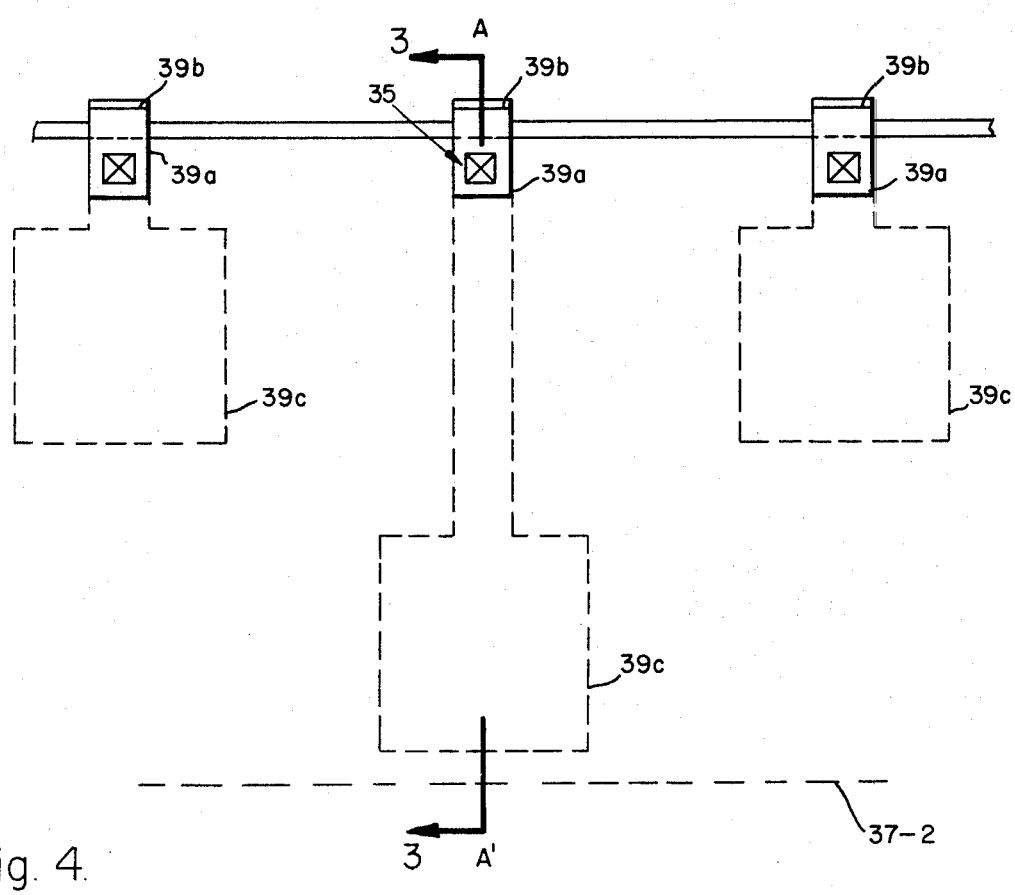
FIG. 4 is a plan view of a silicon die after the edge-around connectors have been formed on it.

After the cutting and burnishing steps have been performed, the silicon die 13 receives a layer of insulation 37 (FIG. 3b) which extends from its top toward its side 13a, around that side and along the bottom of the die where it terminates along a line 37-2 as shown in FIG. 4. This insulating layer, whose purpose is to isolate the contacts which are next to be formed from the silicon die 13, may be formed by sputtering. A 5,000 Angstrom thick layer of silicon dioxide has been found to be suitable. A particularly useful way in which this can be accomplished will be described hereinafter with reference to FIGS. 5 and 6.

Figure 3C:
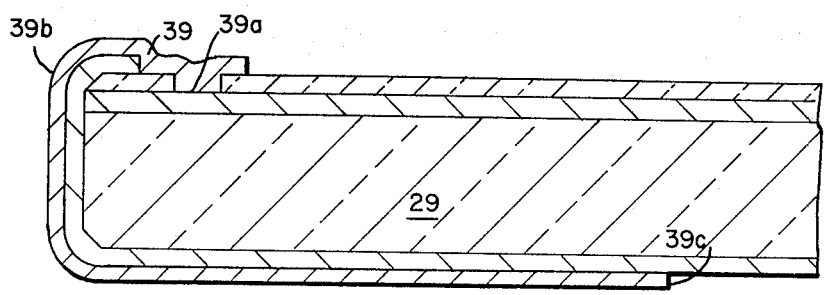

Extending around the side 13a of the die 13 are a plurality of connectors 39 as illustrated in FIG. 3c. One of the connectors 39 illustrated in FIG. 3c is seen in FIG. 4 to comprise a top terminal 39a, an intermediate portion 39b which extends down the side 13a and a bottom terminal 39c which is considerably larger than the first terminal 39a. The top terminal 39a extends through the opening 35 into contact with one of the conductors 31. A particularly advantageous method whereby the metal contacts 39 may be formed will be described in greater detail hereinafter with reference to FIGS. 7-10. It will suffice to say at this time that a 1,000 Angstrom thick layer of aluminum has been found suitable for the connectors 39.

Figure 3D:
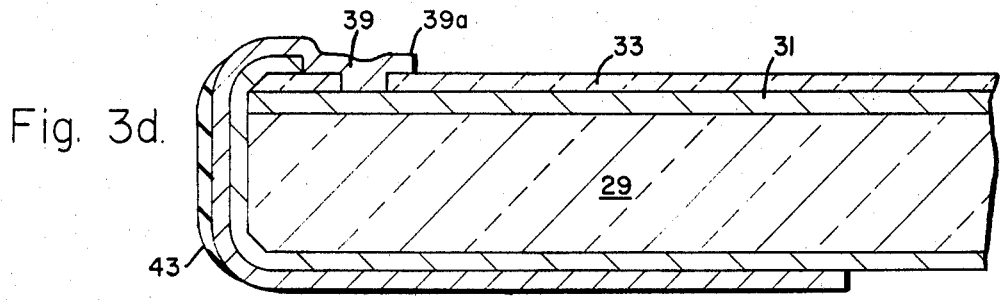

In order to prevent undesirable shorting to adjacent units, an additional insulating layer 43 is formed over the central portion 39b of the contacts 39 as shown in FIG. 3d. A 3,000 Angstrom layer of silicon dioxide formed by sputtering has been found suitable for this purpose.

Figure 3E:
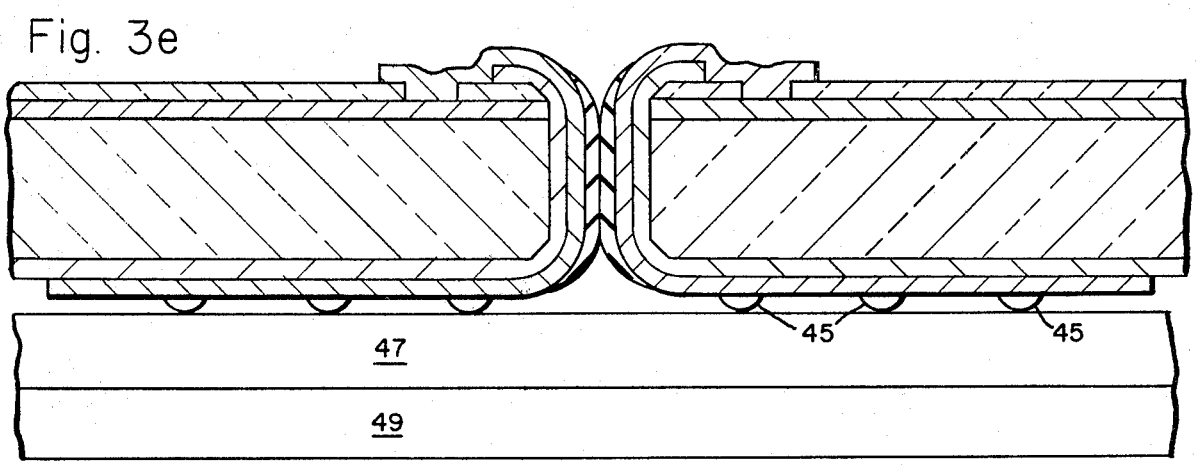

FIG. 3e illustrates the last step in the process, resulting in the desired connector structure. It also illustrates in dashed lines a portion of a bridging connector 47 which serves to connect the around-the-edge connector of a given silicon die to a corresponding such connector on an adjacent such die. Typically, the bridging connector 47 is formed on top of a glass supporting plate 49, and it extends at its opposite ends into contact with the bottom terminals 39c of a pair of interfacing silicon dice. In FIG. 3e only one-half of the bridging connector 47 is shown.

In order to insure good connection from the terminal 39c to the bridging connector 47 a plurality of bumps 45 are deposited on the terminal. Ideally these bumps should be easily deformable when the silicon die is pressed down onto the supporting plate 47. Indium bumps, approximately 0.003 inch in diameter and 0.003 inch thick have been found to serve this purpose.

Referring now to FIGS. 5 and 6 a particularly convenient method for depositing an insulating layer onto at least two silicon die will be described. The key to this method is to place a pair of silicon dice 53 and 55 in a staggered stack on the working platform of a conventional sputtering machine, and to incline them at an angle of 26.6°. The reason for the particular angle will become apparent as this description proceeds. The insulating layer to be deposited, such as silicon dioxide, is sputtered at the two dice 53 and 55 so that the material impinges on them as indicated by the arrows 56. As a result, an oxide layer 57 of the desired thickness is formed on the bottom of the silicon die 53 and, because of the selected angle, an oxide layer 57-1, which is one-half the desired thickness, is deposited around its end as shown. At the same time, the second silicon die 55 also receives over the exposed end of its top surface a short layer 59 which is of the desired thickness and, over its end, a layer 59-1 which is one-half the desired thickness. Thus, the upper die 53 serves as a mask for the bottom die 55 so as to define the extent of the relatively short strip of insulation 59 to be formed on its top. Next, as shown in FIG. 6, the two dice 53 and 55 are reversed in the sputtering machine so that the die 55 is on top and the die 53 on the bottom. There, again supported at the same 26.6° angle, the now top disposed silicon die 55 receives on its bottom surface a layer 61 of silicon dioxide which is again of the desired thickness and receives over the previously deposited oxide layer 59-1 an additional half thickness of oxide layer 61-1. At the same time, the bottom wafer 53 receives over the exposed portion of its top surface an oxide layer 63 of the desired thickness and over its end another half thick layer of oxide 63-1. Thus, it may be seen during the two steps illustrated in FIGS. 5 and 6 an oxide layer of uniform thickness has been deposited on both of the silicon dice 53 and 55 in the desired configuration.

Referring next to FIGS. 7, 8 and 9 a convenient mask for defining the pattern of metal around the edge connectors will be described. The mask assembly 70 is made up of three copper-beryllium plates 71, 73 and 75 fastened together in the configuration shown. Each of the plates includes a plurality of slots. Two of plates 71 and 73 are bent at right angles and, thus bent, are mounted on the third plate 75 so that their respective slots 71-1 and 73-1 are aligned with each other and with the slots 75-1 of the bottom plate 75. Enough space is provided between the upright plates 71 and 73 to receive snugly the silicon die 13. Collectively, each set of slots 71-1, 73-1 and 75-1 leaves a U-shaped portion of the silicon die 13 exposed.

The entire assembly 70, with the silicon die 13 in it, is placed in a bell jar 71 containing a metal evaporation source 73 (FIG. 10). An electron beam would be a suitable such source. The equipment for evaporating a metal film on a substrate is described in detail in U.S. Pat. No. 3,928,671 and need not be described again here. It will be sufficient to point out that, in order to insure that the metal is deposited evenly on the exposed surfaces of the silicon die, the assembly 70 is turned gradually through an arc, as shown in FIG. 10, relative to the evaporation source 73. In this manner, it has been found possible to deposit an aluminum layer of the desired thickness in an even pattern in the configuration illustrated in FIG. 3c.

What is claimed is:

1. A method of forming contacts on a semi-conductor circuit die having first and second major surfaces and at least one straight side, with a circuit and conductors being contained on at least a first of the major surfaces, comprising the steps of:

(a) removing corner edge portions from the die at the intersection of each of its major surfaces with the one side;

(b) applying an insulating layer of uniform thickness around the one side; and (c) forming a plurality of contact strips extending from the conductors on the first major surface, over the insulating layer, around the one side, and to the second surface by depositing metal in uniform thickness from a source onto masked areas of the die while turning the die relative to the source.

2. The method of claim 1 wherein said step of forming the strips of metal further includes the steps of:
   (a) masking the die to expose a plurality of parallel U-shaped strips thereof; and
   (b) evaporating the metal from the source onto the masked die areas.

3. The method of claim 1 in which said removing step comprises the step of bevelling the die side.

4. The method of claim 1 in which said removing step comprises the step of burnishing the die side.

5. The method of claim 1 in which said applying step comprises the step of sputtering the insulating layer around the one side.

6. The method of claim 1 in which said depositing step comprises the step of evaporating the metal from the source.

* * * * *